United States Patent

Minaguchi et al.

(10) Patent No.: US 9,507,377 B2
(45) Date of Patent: Nov. 29, 2016

(54) ELECTRONIC DEVICE

(71) Applicant: Kabushiki Kaisha Toshiba, Tokyo (JP)

(72) Inventors: Hiroyuki Minaguchi, Higashimatsuyama Saitama (JP); Ryosuke Saito, Koganei (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 154 days.

(21) Appl. No.: 14/469,299

(22) Filed: Aug. 26, 2014

(65) Prior Publication Data

US 2015/0146351 A1 May 28, 2015

Related U.S. Application Data

(60) Provisional application No. 61/908,574, filed on Nov. 25, 2013.

(51) Int. Cl.
*H05K 5/02* (2006.01)
*G06F 1/16* (2006.01)

(52) U.S. Cl.
CPC .......... *G06F 1/1616* (2013.01); *G06F 1/1658* (2013.01); *G06F 1/1656* (2013.01); *H05K 5/0221* (2013.01)

(58) Field of Classification Search
CPC .. G06F 1/1601; G06F 1/1616; G06F 1/1656; G06F 1/1658; G06F 2200/1612; G06F 2200/1631; G06F 1/1632; G06F 1/1626; H05K 5/0221; H05K 5/06
USPC ............ 361/679.01, 679.02, 679.21, 679.26, 361/679.27, 679.55–679.58, 724–727; 248/917–924
See application file for complete search history.

(56) References Cited

U.S. PATENT DOCUMENTS

| | | | | |
|---|---|---|---|---|
| 7,274,556 B2 * | 9/2007 | Chung | ................... | F16M 11/00 248/121 |
| 7,476,462 B2 * | 1/2009 | Song | ................... | H01M 2/1022 429/100 |
| 8,897,018 B2 * | 11/2014 | Suwa | ................... | H04N 5/64 361/679.01 |
| 2004/0117955 A1 * | 6/2004 | Barvosa-Carter | .. | A44B 18/0007 24/442 |

FOREIGN PATENT DOCUMENTS

| | | |
|---|---|---|
| JP | 2003-348729 | 12/2003 |
| JP | 2004-221121 | 8/2004 |
| JP | 2013-004617 | 1/2013 |
| JP | 2013-059138 | 3/2013 |

* cited by examiner

*Primary Examiner* — Anthony Haughton
*Assistant Examiner* — Ingrid Wright
(74) *Attorney, Agent, or Firm* — Rutan & Tucker, LLP (57) ABSTRACT

According to one embodiment, an electronic device includes a housing, a member, and an intervening portion. The housing includes a pair of first hook portions extending in one direction and an opening extending in the one direction and being between the pair of first hook portions. The member includes a pair of second hook portions configured to catch the first hook portions and is movable in the opening in the one direction. The intervening portion is configured to be between the pair of second hook portions. The intervening portion is configured to keep the member to be in a movable state and to come into contact with the second hook portions that elastically approach to each other such that the second hook portions keep catching the first hook portions.

20 Claims, 11 Drawing Sheets

ELECTRONIC DEVICE

This application claims the benefit of U.S. Provisional Patent Application No. 61/908,574, filed Nov. 25, 2013.

FIELD

Embodiments described herein relate generally to an electronic device.

BACKGROUND

The electronic device comprises various movable components.

BRIEF DESCRIPTION OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments will be described hereinafter with reference to the accompanying drawings. In general, according to one embodiment, an electronic device comprises a housing, a member, an intervening portion. The housing comprises a pair of first hook portions extending in one direction and an opening extending in the one direction and being between the pair of first hook portions. The member comprises a pair of second hook portions configured to catch the first hook portions and is movable in the opening in the one direction. The intervening portion is configured to be between the pair of second hook portions. The intervening portion is configured to keep the member in a movable state and come into contact with the second hook portions that elastically approach to each other in such a manner that the second hook portions keep catching the first hook portions.

The following describes a first embodiment with reference to FIGS. 1 to 9. In the present specification, directions are basically defined as follows: a side adjacent to a user is the front direction, a side away from the user is the back direction, the left side viewed from the user is the left direction, the right side viewed from the user is the right direction, the upper side viewed from the user is the upper direction, and the lower side viewed from the user is the lower direction. The elements in the embodiment and the explanations thereof may be described by a plurality of expressions. Any expressions of the elements and explanations thereof other than the expressions described herein are applicable. In addition, any expressions of the elements and explanations thereof, which are not described by multiple expressions, other than the expressions described herein are applicable.

Figure 1:
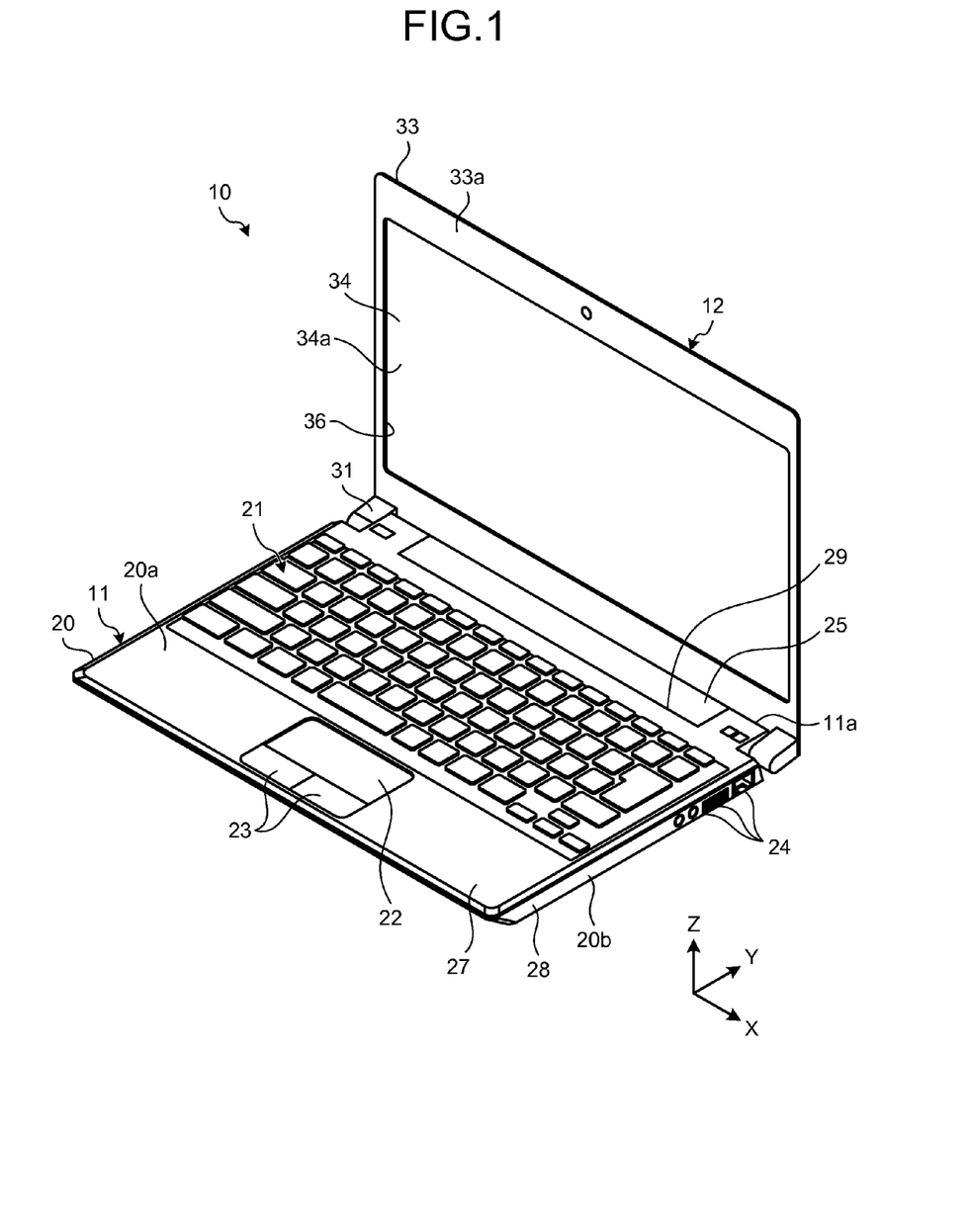
FIG. 1 is an exemplary perspective view illustrating a portable computer according to a first embodiment.

FIG. 1 is a perspective view illustrating a portable computer 10 according to the first embodiment. The portable computer 10 is an example of the electronic device. The electronic device is not limited to the portable computer 10, the electronic device may be a tablet device, a television receiver, a display, a mobile phone, a smartphone, a mobile game machine, a car navigation system, a digital camera, a printer, a copier, or other devices.

As illustrated in FIG. 1, the portable computer 10 comprises a first portion 11 and a second portion 12. The first portion 11 can also be described as a unit, a module, a base, or a main body, for example. The second portion 12 can also be described as a unit, a module, a display, a monitor, or a display portion, for example.

As illustrated in the drawings, the X axis, the Y axis, and the Z axis are defined in the specification. The X, Y, and Z axes are orthogonal to each other. The X axis is along the width of the first portion 11. The Y axis is along the length of the first portion 11. The Z axis is along the thickness of the first portion 11.

The first portion 11 comprises a first housing 20, a keyboard 21, a touch pad 22, a pair of buttons 23, a plurality of external connection connectors 24, and a battery unit 25. The first housing 20 is an example of the housing, and can also be described as an outer shell, a wall, a partition wall, or a member, for example. The key board 21, the touch pad 22, and the buttons 23 can also be described as input portions. The external connection connectors 24 can also be described as parts or electronic parts, for example. The battery unit 25 is an example of the part, and can also be described as a battery pack, a power feed portion, or an external connection part, for example. The part, however, is not limited to the battery unit 25, the part may be an external storage device or another part such as a docking station.

The key board 21, the touch pad 22, and the buttons 23 are provided on a top face 20a of the first housing 20. The key board 21, the touch pad 22, and the buttons 23 may be provided in another area. The external connection connectors 24 open on a side face 20b of the first housing 20. The external connection connectors 24 are USB connectors, LAN connectors, or earphone jacks, for example.

The first housing 20 is formed of a magnesium alloy, for example. The first housing 20 may be formed of another material such as a resin. The first housing 20 comprises a top cover 27 and a bottom cover 28.

The top cover 27 is overlapped with the bottom cover 28 in the thickness direction and attached to the bottom cover 28 with screws and/or claws, for example. The top cover 27 forms the top face 20a of the first housing 20. The top cover 27 and the bottom cover 28 together form the side face 20b of the first housing 20.

The battery unit 25 is a lithium-ion secondary battery, for example. The battery unit 25 may be another type of battery. The battery unit 25 is fitted in a depressed portion 29 provided to a rear end portion 11*a* of the first portion 11. The depressed portion 29 is an example of a portion subjected to attachment. The battery unit 25 is fitted in the depressed portion 29 to supply power to the portable computer 10.

The second portion 12 is attached to the rear end portion 11*a* of the first portion 11 with a hinge portion 31. The second portion 12 is rotatable between an open position and a closed position with respect to the first portion 11. At the closed position, the second portion 12 overlaps with the first portion 11 and covers the top face 20*a* of the first housing 20. At the open position, the second portion 12 stands from the rear end portion 11*a* of the first portion 11 and the top face 20*a* of the first housing 20 is exposed.

The second portion 12 comprises a second housing 33 and a display module 34. The second housing 33 houses the display module 34. A front face 33*a* of the second housing 33 is provided with a display opening 36. The front face 33*a* of the second housing 33 faces the top face 20*a* of the first housing 20 at the closed position. The display opening 36 may be covered with a glass plate or an acrylic pate at least a part of which is transparent, for example.

The display module 34 is a liquid crystal display (LCD), for example. The display module 34 is not limited to this example and may be another device displaying an image such as a plasma display, an organic EL display (GELD), or electronic paper.

The display module 34 comprises a screen 34*a* exposed by the display opening 36. The display module 34 displays an image on the screen 34*a*. In the specification, examples of the "image" include still images, moving images, single color images, and characters.

Figure 2:
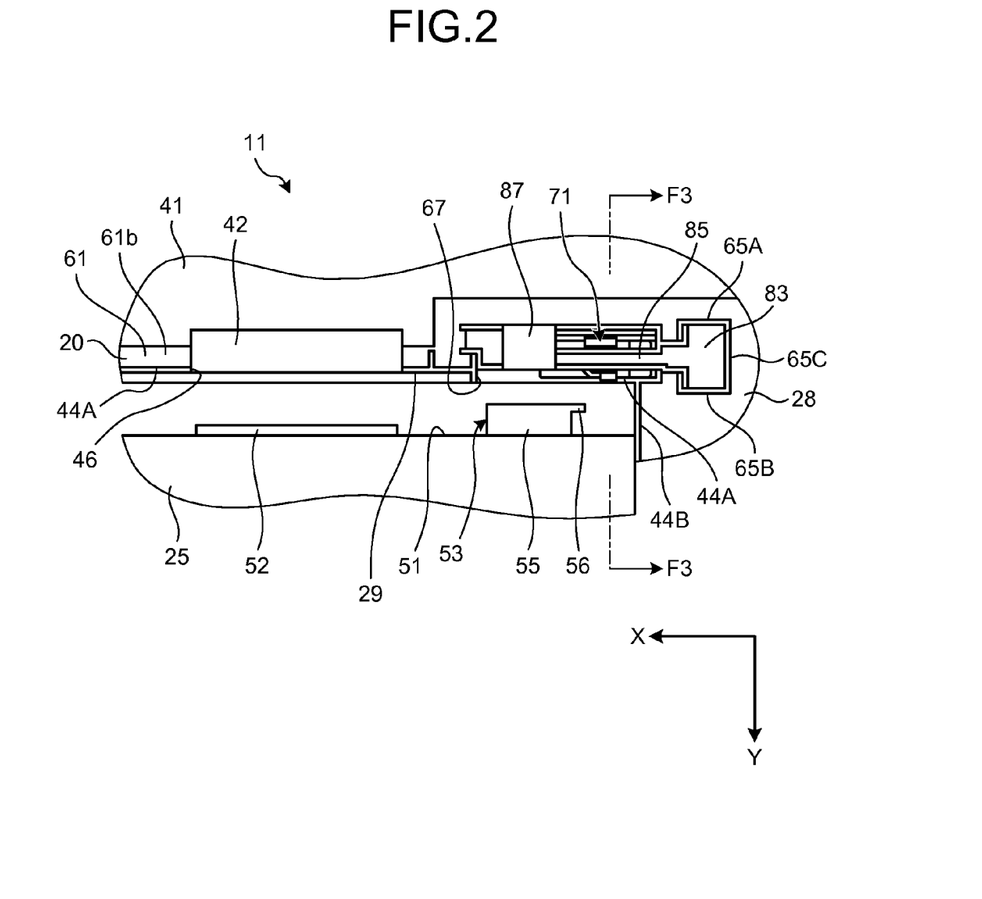
FIG. 2 is an exemplary plan view schematically illustrating a part of a first portion in the first embodiment.
Figure 3:
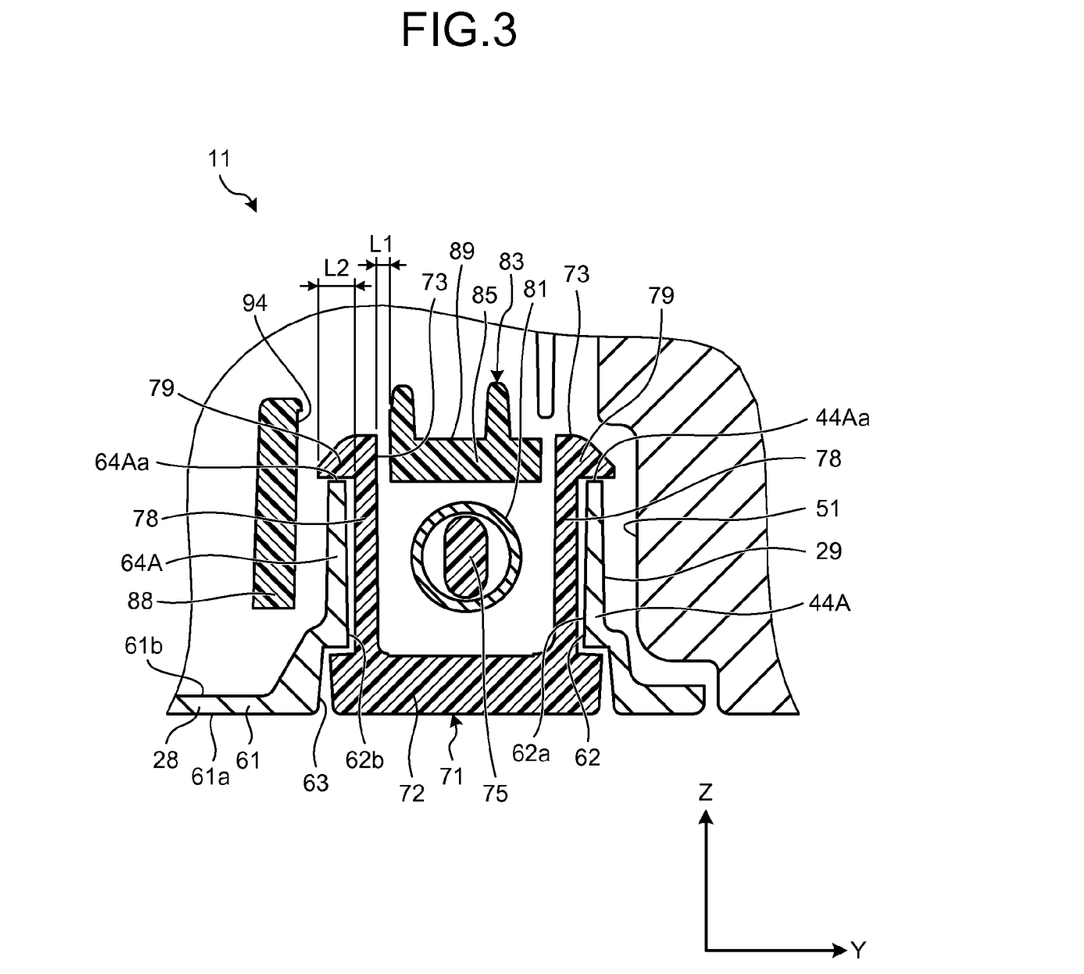
FIG. 3 is an exemplary cross-sectional view illustrating a part of the first portion along line F3-F3 of FIG. 2 in the first embodiment.
Figure 4:
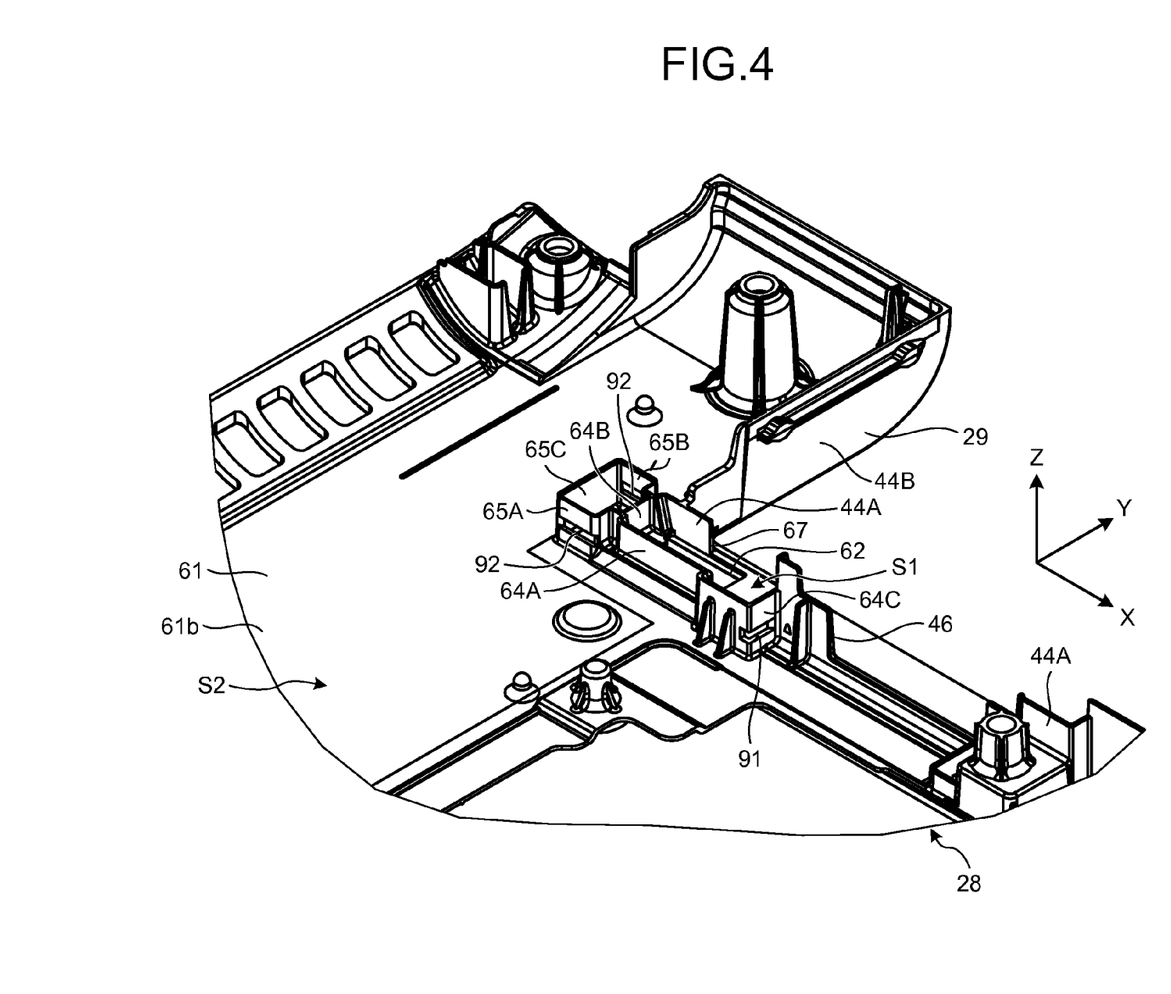
FIG. 4 is an exemplary perspective view illustrating inside of a bottom cover in the first embodiment.

FIG. 2 is a plan view schematically illustrating a part of the first portion 11 removed the top cover 27. FIG. 3 is a cross-sectional view illustrating a part of the first portion 11 along line F3-F3 of FIG. 2. FIG. 4 is a perspective view illustrating inside of the bottom cover 28.

As illustrated in FIG. 2, the first housing 20 houses a substrate 41. The substrate 41 is an example of the electronic part, and is a printed circuit board (PCB) called a mother board, for example. The electronic part, however, is not limited to this example, and may be another type of substrate such as a daughter board, a hard disk drive (HDD), an optical disc drive (ODD), a cable, or another electronic part such as a connector.

On the substrate 41, a first power feed connector 42, and the multiple external connection connectors 24 illustrated in FIG. 1 are mounted. On the substrate 41, a central processing unit (CPU), a memory, a connector, and various parts are mounted.

The bottom cover 28 comprises a plurality of first ribs 44A and 44B. The first rib 44A is an example of the first hook portion and a rib, and can also be described as a receiving portion, an extending portion, a wall, a protruded portion, a guide, or a rail, for example. The first ribs 44A extend in a direction along the X axis. The direction along the X axis is an example of the one direction. The first rib 44B extends along the Y axis. The first ribs 44A and 44B are arranged in a substantially U-shape and form the depressed portion 29.

The first rib 44A is provided with an exposure opening 46. The exposure opening 46 is an opening or a notch that opens toward the outside of the first housing 20, for example. The exposure opening 46 exposes the first power feed connector 42. The first power feed connector 42 is located in the depressed portion 29.

The battery unit 25 has an attaching face 51. The attaching face 51 faces the first rib 44A. On the attaching face 51, a second power feed connector 52 and a protrusion 53 are provided. The protrusion 53 is an example of a first fitting portion, and can also be described as a protruded portion, an attaching portion, a fixing portion, a claw, a catching portion, or a fastened portion, for example.

As a result of fitting of the battery unit 25 in the depressed portion 29, the second power feed connector 52 is attached to the first power feed connector 42. Terminals of the second power feed connector 52 are electrically connected to the terminals of the first power feed connector 42. As a result, the buttery unit 25 supplies power to the portable computer 10.

The protrusion 53 comprises a protruded portion 55 and a claw portion 56. The protruded portion 55 protrudes from the attaching face 51 in a direction along the Y axis. The claw portion 56 extends from the end portion of the protruded portion 55 in the direction along the X axis. As a result, the attaching face 51, the protruded portion 55, and the claw portion 56 form a recess.

As illustrated in FIG. 3, the bottom cover 28 comprises a bottom wall 61. The bottom wall 61 is formed in a platy shape. The bottom wall 61 comprises an outer face 61*a* and an inner face 61*b*. The outer face 61*a* of the bottom wall 61 faces a face on which the portable computer 10 is placed when the portable computer 10 is placed, for example. The inner face 61*b* is located opposite the outer face 61*a*. The first ribs 44A and 44B protrude from the inner face 61*b* of the bottom wall 61 in a direction along the Z axis.

As illustrated in FIGS. 3 and 4, on the bottom wall 61, an opening 62, a recess 63, a plurality of second ribs 64A, 64B, and 64C, and a plurality of third ribs 65A, 65B, and 65C are provided. The opening 62 can also be described as an insert-through portion or a space, for example. The second rib 64A is an example of the first hook portion and the rib similarly to the first rib 44A, and can also be described as a receiving portion, an extending portion, a wall, a protruded portion, a guide, or a rail, for example.

The opening 62 opens on the inner face 61*b* of the bottom wall 61 and is a substantially quadrangular hole extending in the direction along the X axis. Thus, the opening 62 extends substantially in parallel with the first rib 44A. The opening 62 may be a notch as a hole partially opened. As illustrated in FIG. 3, the opening 62 comprises a pair of edges 62*a* and 62*b*. The pair of edges 62*a* and 62*b* extend in the direction along the X axis and face each other.

The recess 63 is provided on the outer face 61*a* of the bottom wall 61. The recess 63 is provided at the position that corresponds to the opening 62. The recess 63 is wider than the opening 62. The opening 62 opens to the recess 63. In other words, the opening 62 and the recess 63 continue to each other.

As illustrated in FIG. 4, the first ribs 44A and 44B, the second ribs 64A, 64B, and 64C, and the third ribs 65A, 65B, and 65C are integrated and protrude from the inner face 61*b* of the bottom wall 61. At least one of the first ribs 44A and 44B, the second ribs 64A, 64B, and 64C, and the third ribs 65A, 65B, and 65C may be a separated member.

The second rib 64A extends in the direction along the X axis. The second rib 64A thus extends substantially in parallel with the first rib 44A and the opening 62. As illustrated in FIG. 3, the height of the second rib 64A (the distance from the inner face 61*b* of the bottom wall 61 to a distal end 64Aa of the second rib 64A) is substantially equal to the height of the first rib 44A (the distance from the inner face 61b of the bottom wall 61 to a distal end 44Aa of the first rib 44A). The height of the second rib 64A and the height of the first rib 44A may differ from each other.

The first rib 44A extends along one edge 62a of the opening 62. The second rib 64A extends along the other edge 62b of the opening 62. The opening 62 is located between the first rib 44A and the second rib 64A.

The first rib 44A continues to one edge 62a of the opening 62. The second rib 64A continues to the other edge 62b of the opening 62. The first rib 44A may be apart from the edge 62a of the opening 62, and the second rib 64A may be apart from the edge 62b of the opening 62.

As illustrated in FIG. 4, the second ribs 64B and 64C extend along the Y axis. The first rib 44A and the second ribs 64A, 64B, and 64C are such arranged that they form a substantially quadrangle.

The first housing 20 comprises a first section S1 and a second section S2. The first section S1 is surrounded by the first rib 44A, and the second ribs 64A, 64B, and 64C. The first section S1 and the second section S2 are partitioned by the second ribs 64A, 64B, and 64C. The opening 62 is located in the first section S1. In the second section S2, the substrate 41 is disposed.

The first rib 44A is provided with an insertion portion 67. The insertion portion 67 can also be described as a pass-through portion, a hole, an open portion, or an opening, for example. The insertion portion 67 is a cutout, however, the insertion portion 67 may be a hole, for example. The insertion portion 67 opens in the first section S1. In other words, the first section S1 is open to the outside by the insertion portion 67. The insertion portion 67 is located at a position that corresponds to the protrusion 53 of the battery unit 25, and has a size capable of allowing the protrusion 53 to pass through the insertion portion 67.

The third ribs 65A, 65B, and 65C are located in the second section S2. The third ribs 65A and 65B extend in the direction along the X axis and face each other. The third rib 65C extends in the direction along the Y axis and faces the second rib 64B. The second rib 64B and the third ribs 65A, 65B, and 65C are such arranged that they form a substantially quadrangle.

As illustrated in FIG. 3, the first portion 11 has a battery releasing latch (hereinafter described as the latch) 71. The latch 71 is an example of the member, and can also be described as a battery lock, a sliding member, a fitting member, a fixing member, or an attaching member, for example.

Figure 5:
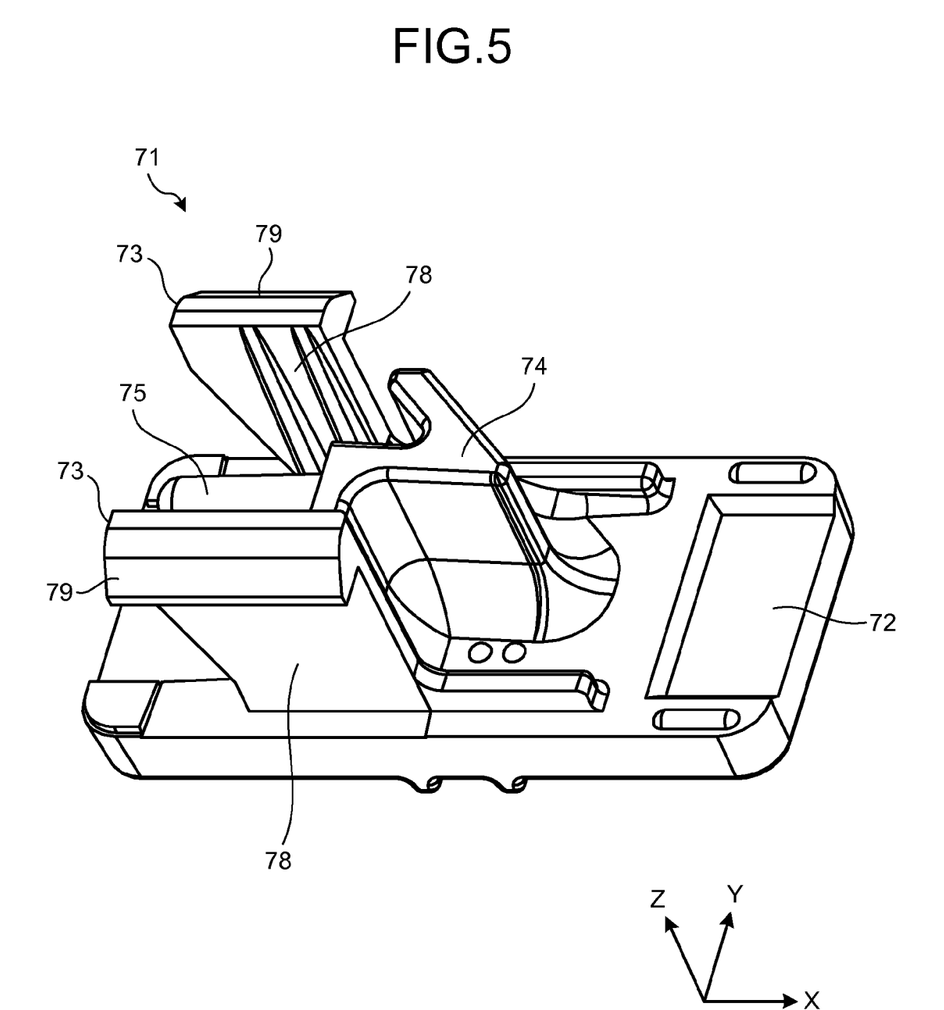
FIG. 5 is an exemplary perspective view illustrating a latch in the first embodiment.

FIG. 5 is a perspective view illustrating the latch 71. The latch 71 is formed of a resin, for example. Thus, the bottom cover 28, which is formed of a magnesium alloy, is harder than the latch 71 formed of a resin. The latch 71 may be formed of another elastically deformable material.

As illustrated in FIG. 5, the latch 71 comprises an operated portion 72, a pair of hook portions 73, a locking portion 74, and an attaching bar 75. The operated portion 72 is an example of a wall portion, and can also be described as a base portion, an acted portion, or a portion to be pushed, for example. The hook portions 73 is an example of the second hook portions, and can also be described as claws, elastic portions, or attaching portions, for example. The locking portion 74 is an example of a second fitting portion, and can also be described as a fixing portion, an attaching portion, or a catching portion, for example.

The operated portion 72 is formed in an substantially quadrangular platy shape. The shape of the operated portion 72, however, is not limited to this shape. The width (the length in the short side direction or the length in the direction along the Y axis) of the operated portion 72 is slightly smaller than the width of the recess 63. The length (the length in the longitudinal direction or the length in the direction along the X axis) of the operated portion 72 is smaller than the length of the opening 62.

As illustrated in FIG. 3, the operated portion 72 is fitted in the recess 63. The operated portion 72 is exposed outside the portable computer 10. As a result, the operated portion 72 can be moved by fingers of a user, for example.

The hook portions 73 each comprise a flexible portion 78 and a claw 79. The flexible portion 78 can also be described as a protruded portion, a deforming portion, a wall, or an extending portion, for example. The claw 79 can also be described as a contacting portion, a fitting portion, a portion to be supported, or a catching portion, for example.

The flexible portions 78 protrude from the operated portion 72 along the Z axis. The flexible portion 78 is a platy portion extending in the direction along the X axis. Thus, the pair of hook portions 73 extend substantially in parallel with each other along the X axis. The flexible portions 78 can be elastically deformed such that they approach to each other. Parts of the two flexible portions 78 are located between the pair of edges 62a and 62b of the opening 62.

The claw 79 is provided at the distal end of the flexible portion 78. The claw 79 may be provided at another part of the flexible portion 78. The two claws 79 protrude outside the respective flexible portions 78. In other words, the two claws 79 protrude in the opposite directions along the Y axis.

One hook portion 73 is adjacent to the first rib 44A. The one hook portion 73 may come into contact with the first rib 44A or may be slightly apart from the first rib 44A. The claw 79 of the one hook portion 73 catches the distal end 44Aa of the corresponding first rib 44A. In other words, the claw 79 is supported by the distal end 44Aa of the first rib 44A. The distal end 44Aa is the end portion, which is far from the bottom wall 61, of the first rib 44A.

The other hook portion 73 is adjacent to the second rib 64A. The other hook portion 73 may come into contact with the second rib 64A or may be slightly apart from the second rib 64A. The claw 79 of the other hook portion 73 catches the distal end 64Aa of the corresponding second rib 64A. In other words, the claw 79 is supported by the distal end 64Aa of the second rib 64A. The distal end 64Aa is the end portion, which is far from the bottom wall 61, of the second rib 64A.

As a result of the claw 79 of the hook portion 73 catching the first rib 44A, the operated portion 72 and the claw 79 sandwiches the first rib 44A. As a result of the claw 79 of the hook portion 73 catching the second rib 64A, the operated portion 72 and the claw 79 sandwiches the second rib 64A.

The latch 71 is attached to the first housing 20 from outside of the first housing 20. For example, the pair of hook portions 73 are inserted in the opening 62 from the outside of the first housing 20. In the insertion, the hook portions 73 are pushed by the edges 62a and 62b of the opening 62, and the first rib 44A and the second rib 64A, thereby causing the two flexible portions 78 to elastically approach to each other. When the operated portion 72 is fitted in the recess 63, the flexible portions 78 return to the original shapes, thereby causing one claw 79 to catch the distal end 44Aa of the first rib 44A and the other claw 79 to catch the distal end 64Aa of the second rib 64A. The claws 79 prevent the latch 71 from coming off the opening 62. The attached latch 71 is located in the first section S1.

When the latch 71 is removed from the first housing 20, the flexible portions 78 of the pair of hook portions 73 are caused to elastically approach to each other by a user, for example. The approach of the flexible portions 78 to each other results in the claws 79 disengaging from the first rib 44A and the second rib 64A. This thus makes it possible to remove the latch 71 through the opening 62.

Figure 6:
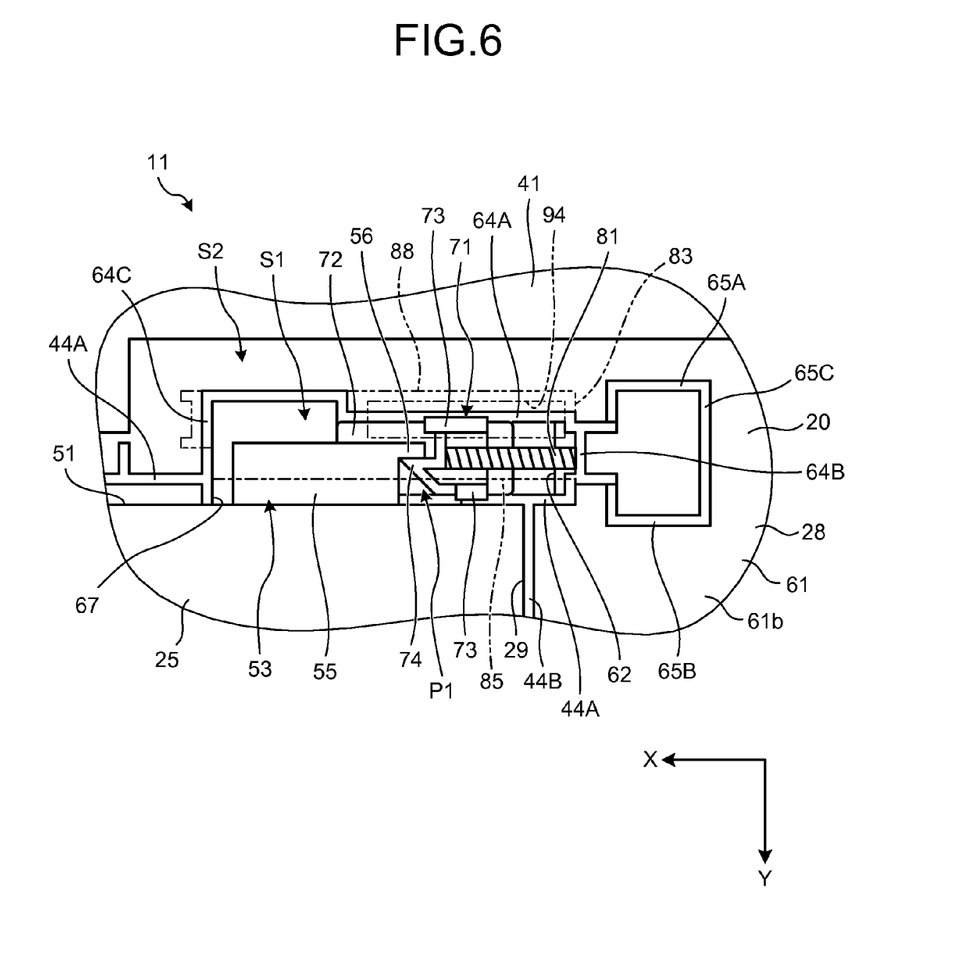
FIG. 6 is an exemplary plan view partially illustrating inside of the first portion in the first embodiment.

FIG. 6 is a plan view partially illustrating inside of the first portion 11. As illustrated in FIG. 6, the locking portion 74 fits together with the protrusion 53 of the battery unit 25 when the battery unit 25 is fitted in the depressed portion 29. The locking portion 74 is fitted in the recess formed by the attaching face 51, and the protruded portion 55 and the claw portion 56 of the protrusion 53. The locking portion 74 catches the claw portion 56 and prevents the battery unit 25 from coming off the depressed portion 29.

A spring 81 is attached to the attaching bar 75. The spring 81 is an example of a moving portion, and can also be described as an acting portion, a pushing portion, or a force applying portion, for example. The spring 81 is a coil spring, for example, the attaching bar 75 is inserted in the spring 81. In other words, the spring 81 is attached to the latch 71. The spring 81 is longer than the attaching bar 75.

The end portion of the spring 81 comes into contact with the second rib 64B. The spring 81 pushes the latch 71 such that the latch 71 moves away from the second rib 64B. The spring 81 passes through between the pair of hook portions 73. In other words, apart of the spring 81 is between the pair of hook portions 73.

Figure 7:
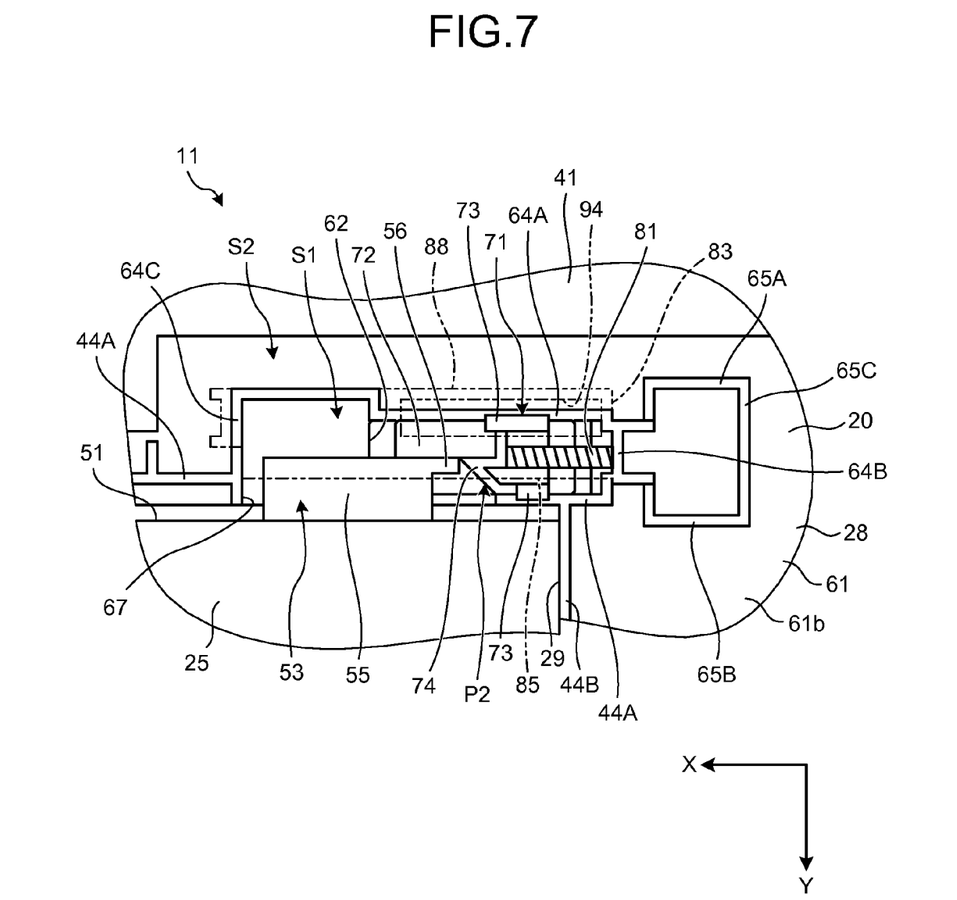
FIG. 7 is an exemplary plan view partially illustrating the inside of the first portion in which the latch has moved in the first embodiment.

FIG. 7 is a plan view partially illustrating the inside of the first portion 11 in which the latch 71 has moved. The latch 71 is movable in the direction along the X axis between a first position P1 illustrated in FIG. 6 and a second position P2 illustrated in FIG. 7. A part of the latch 71 is moved in the opening 62.

As illustrated in FIG. 6, the locking portion 74 of the latch 71 fits together with the protrusion 53 of the battery unit 25 at the first position P1. The first position P1 is the farthest position of the latch 71 from the second rib 64B in a movable range of the latch 71, for example. At the first position P1, the latch 71 abuts the edge of the opening 62. As a result, the latch 71 is prevented from being moved farther from the second rib 64B. The first position P1 is not limited to the position described above.

As illustrated in FIG. 7, the locking portion 74 of the latch 71 disengages from the protrusion 53 of the battery unit 25 at the second position P2. The second position P2 is closer to the second rib 64B than the first position P1. In other words, the locking portion 74 of the latch 71 moved from the first position P1 to the second position P2 is pulled out from the protrusion 53 of the battery unit 25.

As described above, the locking portion 74 catches the claw portion 56, thereby causing the battery unit 25 to be detachably attached to the depressed portion 29 provided to the first housing 20. When the latch 71 is at the first position P1, the battery unit 25 is fixed to the depressed portion 29. When the latch 71 is at the second position P2, the battery unit 25 disengages from the depressed portion 29.

The spring 81 moves the latch 71 from the second position P2 toward the first position P1 by pushing the latch 71. Thus, when no external force is applied to the latch 71, the latch 71 locates at the first position P1.

In the fitting of the battery unit 25 in the depressed portion 29, the protrusion 53 passes through the insertion portion 67 and enters the first section S1. When the protrusion 53 is inserted in the insertion portion 67, the protrusion 53 pushes the locking portion 74 of the latch 71 such that the latch 71 is moved from the first position P1 toward the second position P2. When the battery unit 25 is fitted in the depressed portion 29, no force is applied to the locking portion 74. Thus, the spring 81 moves the latch 71 to the first position P1. As a result, the locking portion 74 of the latch 71 having moved to the first position P1 fits together with the protrusion 53 of the battery unit 25 having entered the first section S1. Thus, the battery unit 25 is fixed to the depressed portion 29 by the latch 71.

As illustrated in FIG. 2, a holder 83 is attached to the bottom cover 28. The holder 83 is an example of the intervenient portion, and can also be described as a wedge portion, a shoring portion, or a filled portion, for example. The holder 83 is made from a resin, for example, and has insulation property. The holder 83 may be formed of another material.

Figure 8:
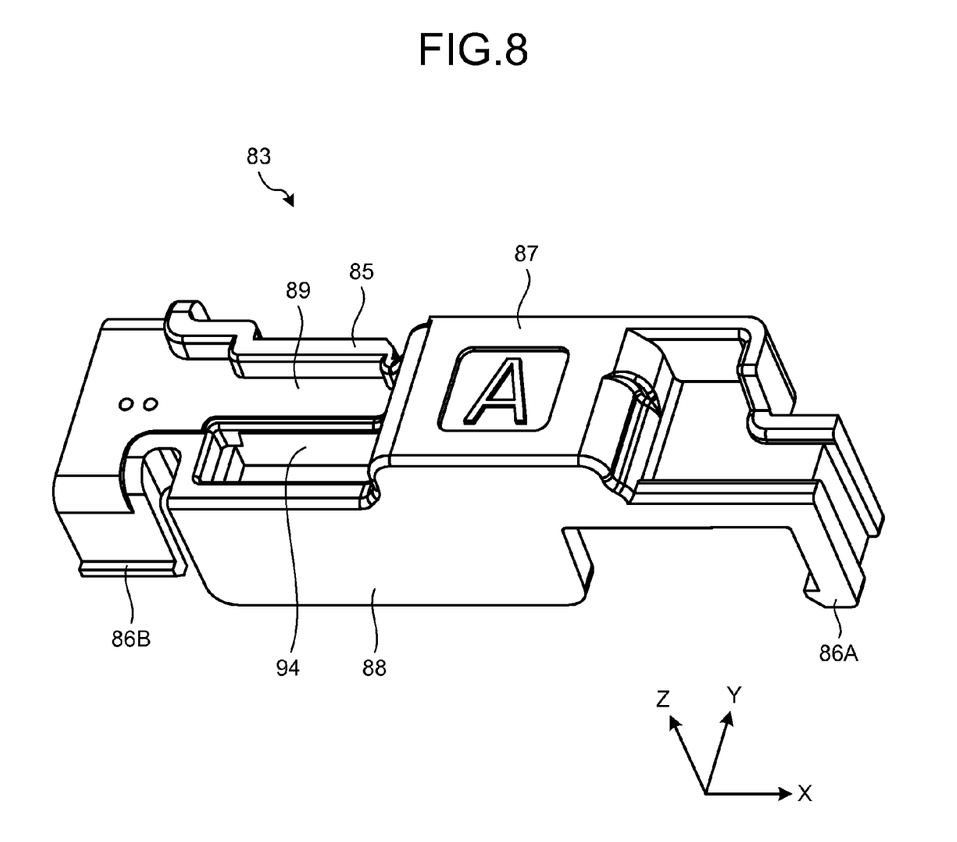
FIG. 8 is an exemplary perspective view illustrating a holder in the first embodiment.

FIG. 8 is a perspective view illustrating the holder 83. As illustrated in FIG. 8, the holder 83 comprises an intervenient portion 85, a fixing claw 86A, two fixing claws 86B, a raised portion 87, and a first partition wall 88. The intervenient portion 85 can also be described as a wedge portion, a shoring portion, or a filled portion, for example. The fixing claws 86A and 86B can also be described as claws, catching portions, fixing portions, or attaching portions, for example. The first partition wall 88 can also be described as a wall, a blind portion, or a closed portion, for example.

The intervenient portion 85 extends in the direction along the X axis. The width (the length in the direction along the Y axis) of the intervenient portion 85 is smaller than the distance between the pair of hook portions 73 of the latch 71. The intervenient portion 85 is provided with a recess 89. The recess 89 is provided on the top face (the face facing in the direction along the Z axis) of the intervenient portion 85, for example. In other words, the cross-sectional face of the intervenient portion 85 has an substantially U-shape. The shape of the intervenient portion 85, however, is not limited to this shape.

As illustrated in FIG. 3, the intervenient portion 85 is located between the pair of hook portions 73. For example, the intervenient portion 85 is between the distal ends of the flexible portions 78 of the hook portions 73. The intervenient portion 85 may be located at another area.

The intervenient portion 85 is apart from the hook portions 73. A distance L1 between the intervenient portion 85 and the hook portion 73 is smaller than a length L2 of the claw 79 of the hook portion 73 protruded from the flexible portion 78. The intervenient portion 85 does not hinder the movement of the latch 71 because the intervenient portion 85 is apart from the hook portions 73. In other words, the intervenient portion 85 keeps a state where the latch 71 is movable.

The intervenient portion 85 may come into contact with the hook portions 73. For example, the intervenient portion 85 comes into contact with the hook portions 73 with a force allowing the latch 71 to be movable. For another example, grease may be present between the intervenient portion 85 and the hook portions 73, thereby causing the latch 71 to move smoothly.

Figure 9:
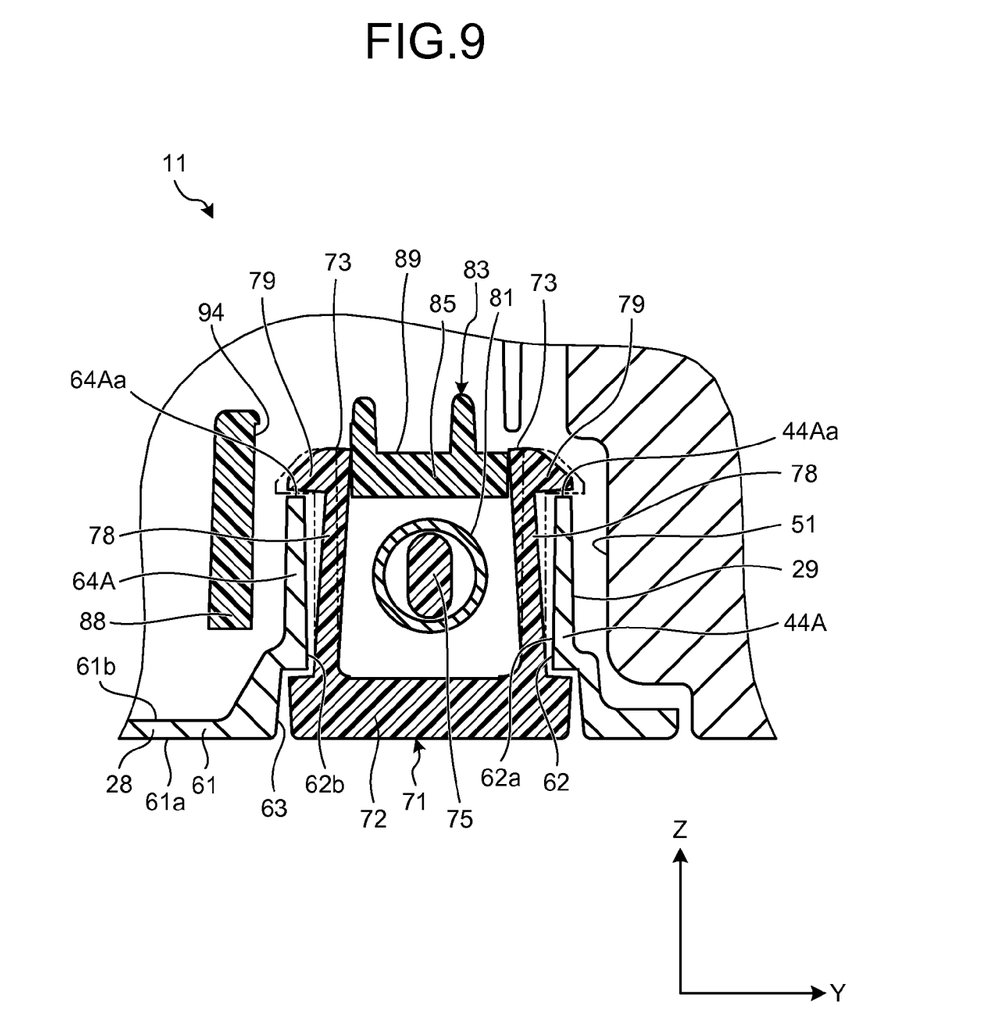
FIG. 9 is an exemplary cross-sectional view illustrating a part of the first portion in which a pair of hook portions approach to each other in the first embodiment.

FIG. 9 is a cross-sectional view illustrating apart of the first portion 11 in which the pair of hook portions 73 approach to each other. As illustrated in FIG. 9, the flexible portions 78 of the pair of hook portions 73 come into contact with the intervenient portion 85 as a result of their elastic approach to each other. When the flexible portions 78 come into contact with the intervenient portion 85, the claws 79 of the hook portions 73 still catch the first rib 44A and the second rib 64A. The intervenient portion 85 thus keeps the hook portions 73 catching the first rib 44A and the second rib 64A. In other words, the intervenient portion 85 prevents the hook portions 73 from disengaging from the first rib 44A and the second rib 64A. The intervenient portion 85 thus can prevent the latch 71 from coming off the opening 62 when the portable computer 10 receives an impact, for example.

The intervenient portion 85 covers the attaching bar 75 of the latch 71 and the spring 81. The intervenient portion 85 is apart from the spring 81. The spring 81 is surrounded by the pair of hook portions 73, the operated portion 72, and the intervenient portion 85. In other words, the intervenient portion 85 holds the spring 81. The intervenient portion 85 thus can prevent the spring 81 from coming off the attaching bar 75. In addition, the intervenient portion 85 can prevent the spring 81 from coming into contact with a part having a circuit such as the substrate 41, for example.

As illustrated in FIG. 4, the second rib 64C is provided with a first slit 91. The first slit 91 extends in the direction along the Y axis. The first slit 91 is also provided to a corner portion between the second rib 64C and the first rib 44A that continue to each other.

Furthermore, the third ribs 65A and 65B are each provided with a second slit 92. The second slit 92 extends in the direction along the X axis. The second slit 92 is also provided to a corner portion between the third ribs 65A and 65C that continue to each other, and a corner portion between the third ribs 65B and 65C that continue to each other.

The fixing claw 86A of the holder 83 elastically catches the first slit 91 of the second rib 64C. The fixing claws 86B elastically catch the second slits 92 of the respective third ribs 65A and 65B. The holder 83 is attached to the bottom cover 28 by the fixing claws 86A and 86B. The holder 83 may be attached to the bottom cover 28 by another way such as screws and an adhesive.

At a time of manufacturing, the latch 71 is attached to the opening 62. The holder 83 is attached to the bottom cover 28 to which the latch 71 has been attached. The hook portions 73 catch the first rib 44A and the second rib 64A, and thereafter the intervenient portion 85 of the holder 83 is placed between the hook portions 73.

The first section S1 is between the second rib 64C that the fixing claw 86A catches and the third ribs 65A and 65B that the respective fixing claws 86B catch. The holder 83 is disposed such that the holder 83 straddles the first section S1 in the direction along the X axis. In other words, the holder 83 covers the first section S1.

As illustrated in FIG. 8, the raised portion 87 is further away from the bottom wall 61 than the intervenient portion 85. The raised portion 87 is formed in a substantially quadrangular shape extending in the direction along the X axis. The raised portion 87 and the intervenient portion 85 are placed side by side in the direction along the X axis. The raised portion 87 is adjacent to the insertion portion 67. On the raised portion 87, a character is formed, for example. The character indicates a type of the holder 83 and a type of the battery unit 25 corresponding to the holder 83, for example.

The first partition wall 88 extends in the directions along the X axis and the Z axis, and is placed side by side on the intervenient portion 85 in the direction along the Y axis. As illustrated with the chain double-dashed line in FIG. 6, the first partition wall 88 is located in the second section S2 and adjacent to the second rib 64A. The second rib 64A and one hook portion 73 are between the intervenient portion 85 and the first partition wall 88.

Between the intervenient portion 85 and the first partition wall 88, an extending hole 94 is provided. The extending hole 94 extends in the direction along the X axis. Apart of the second rib 64A and the claw 79 of one hook portion 73 are exposed by the extending hole 94.

The first partition wall 88 separates the first section S1 from the second section S2 together with the second ribs 64A, 64B, and 64C. For example, the first partition wall 88 covers a gap that is formed between the second rib 64A and the raised portion 87 and leads from the first section S1 to the second section S2, for example. The first partition wall 88 prevents the inside of the second section S2 from being viewed through the insertion portion 67, for example.

In the first embodiment, the intervenient portion 85 of the holder 83 is between the pair of hook portions 73. The intervenient portion 85 comes into contact with the hook portions 73 that elastically approach to each other such that the hook portions 73 keep catching the first rib 44A and the second rib 64A. As a result, the hook portions 73 can be prevented from disengaging from the first rib 44A and the second rib 64A. In addition, the intervenient portion 85 keeps a state where the latch 71 is movable. The intervenient portion 85 does not hinder the movement of the latch 71.

Figure 10:
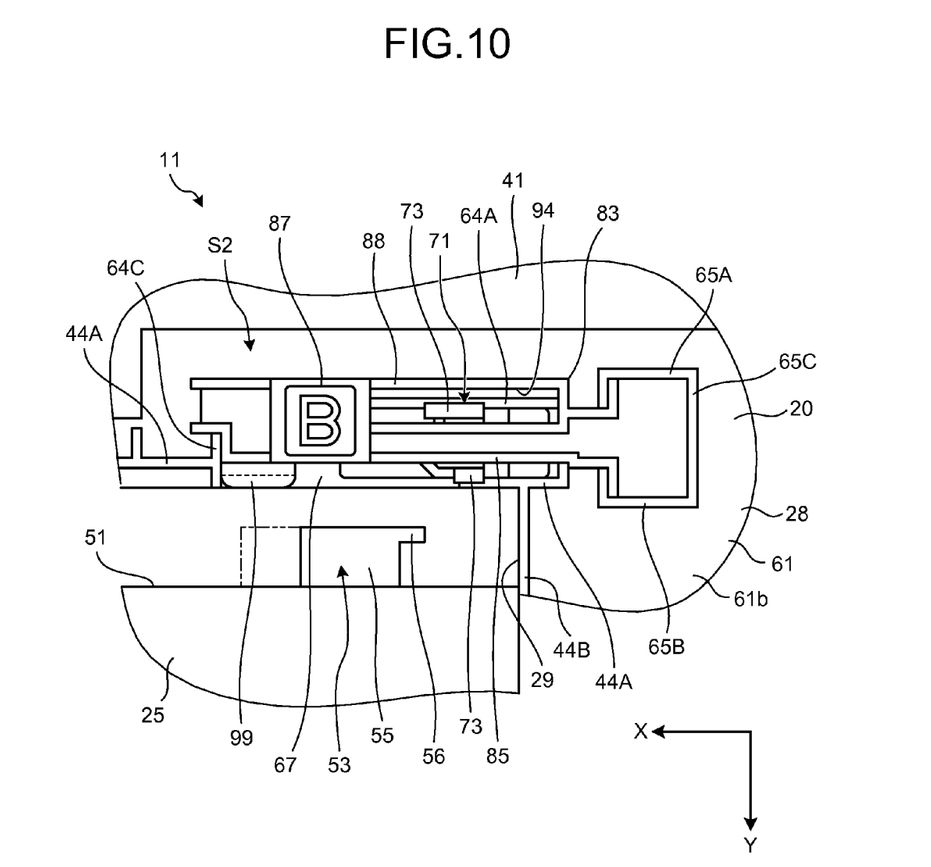
FIG. 10 is an exemplary plan view schematically illustrating a part of the first portion according to a second embodiment.
Figure 11:
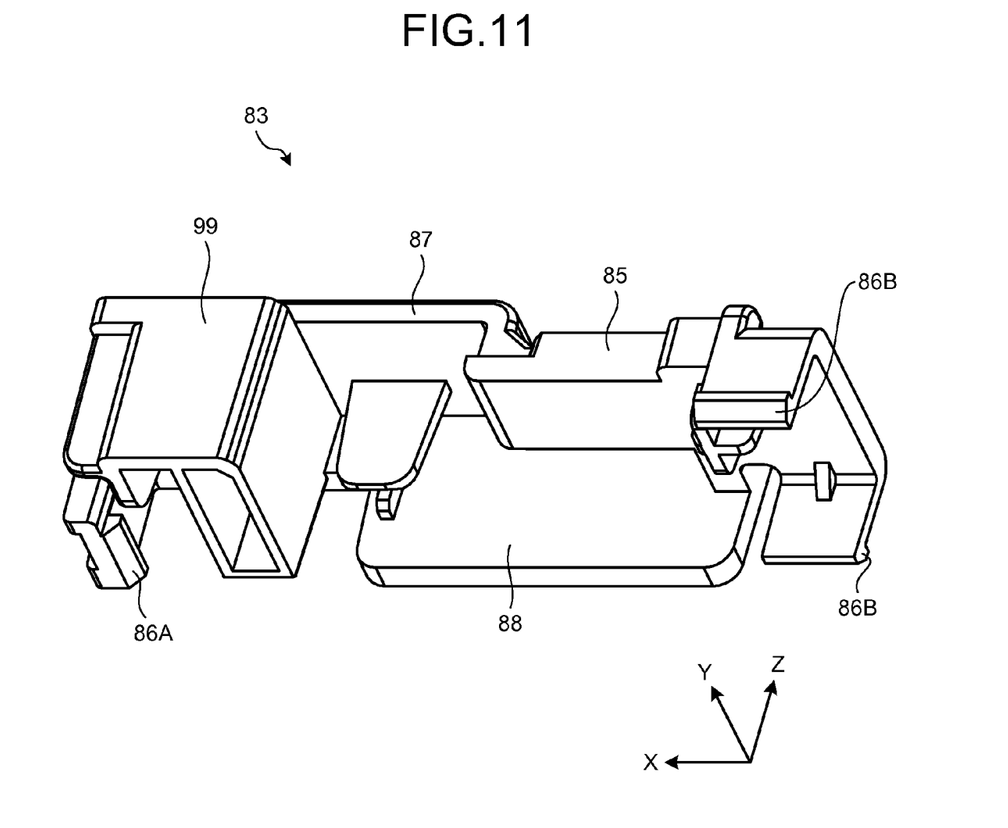
FIG. 11 is an exemplary perspective view illustrating the holder in the second embodiment.

The following describes a second embodiment with reference to FIGS. 10 and 11. In the following description on the embodiment, elements having the same functions as already described elements may be labeled with the same numerals, and descriptions thereof may be omitted. The elements labeled with the same numerals may not have all of the functions and characteristics in common with each other, and may have different functions and characteristics in accordance with the respective embodiments.

FIG. 10 is a plan view schematically illustrating apart of the first portion 11 removed the top cover 27, according to the second embodiment. FIG. 11 is a perspective view illustrating the holder 83 in the second embodiment. As illustrated in FIG. 11, the holder 83 in the second embodiment has a second partition wall 99. The second partition wall 99 can also be described as a wall, or a closing portion, for example.

The second partition wall 99 extends in the directions along the X axis and the Z axis. As illustrated in FIG. 10, the second partition wall 99 partially covers the insertion portion 67. In other words, the insertion portion 67 is narrowed by the second partition wall 99.

On the raised portion 87 in the second embodiment, a character is formed that differs from that of the raised portion 87 in the first embodiment. The battery unit 25 that is a different type from the battery unit 25 in the first embodiment is attached to the portable computer 10 having the holder 83 in the second embodiment. For example, the battery unit 25 in the first embodiment and the battery unit 25 in the second embodiment differ in the number of battery cells and capacity.

The protrusion 53 of the battery unit 25 in the second embodiment is smaller than the protrusion 53 of the battery unit 25 in the first embodiment. The protrusion 53 in the second embodiment can pass through the insertion portion 67 narrowed by the second partition wall 99. In contrast, the protrusion 53 in the first embodiment indicated with the chain double-dashed line in FIG. 10 cannot pass through the insertion portion 67 due to the interference of the second partition wall 99. The second partition wall 99 can prevent the battery unit 25 that is not compatible with the portable computer 10 from being attached to the portable computer 10.

According to at least one of the embodiments described above, the intervenient portion is between the pair of second hook portions and comes into contact with the second hook portions that elastically approach to each other such that the second hook portions keep catching the first hook portions. As a result, the second hook portions are prevented from disengaging from the first hook portions. In addition, the intervenient portion keeps a state where the member is movable. The intervenient portion does not hinder the movement of the member.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in the embodiments described above, the hook portions 73 catch the first rib 44A and the second rib 64A. The second hook portions, however, may catch the edges of the opening, which is an example of the first hook portions.

In the embodiments described above, the latch 71 that fixes the battery unit 25 to the depressed portion 29 is an example of the member. The member, however, is not limited to the member configured to fix another part.

What is claimed is:

1. An electronic device comprising:
   a housing comprising a pair of first hook portions extending in one direction and an opening extending in the one direction and being between the pair of first hook portions;
   a member comprising a pair of second hook portions configured to catch the first hook portions and being movable in the opening in the one direction;
   an intervening portion configured to be between the pair of second hook portions; and
   a moving portion configured to be between the second hook portions and move the member in the one direction, wherein
   the intervening portion is configured to keep the member in a movable state and come into contact with the second hook portions that elastically approach to each other such that the second hook portions keep catching the first hook portions, is configured to be apart from the second hook portions, is configured to be attached to the housing, and is configured to cover the moving portion.

2. The electronic device of claim 1, wherein the intervening portion is configured to be attached to the housing to which the member is already attached.

3. The electronic device of claim 1, wherein the moving portion comprises a spring.

4. The electronic device of claim 3, wherein the intervening portion is an insulator.

5. The electronic device of claim 4, wherein
   the member comprises a wall portion from which the second hook portions protrude, and
   the moving portion is configured to be surrounded by the second hook portions, the wall portion, and the intervening portion.

6. The electronic device of claim 5, further comprising:
   a component configured to be detachably attached to a part subjected to attachment provided to the housing, wherein
   the member is movable between a first position and a second position, the component being configured to be fixed to the part subjected to attachment at the first position, the component being configured to be detached from the part subjected to attachment at the second position.

7. The electronic device of claim 6, wherein the moving portion is configured to move the member from the second position toward the first position.

8. The electronic device of claim 7, wherein
   the component comprises a first fitting portion,
   the member comprises a second fitting portion, and
   the housing comprises an insertion portion and a first section provided with the insertion portion, the first fitting portion being configured to pass through the insertion portion, the first fitting portion being configured to fit together with the second fitting portion located at the first position in the first section.

9. The electronic device of claim 8, wherein the first fitting portion is configured to push the second fitting portion by being inserted in the insertion portion such that the member is moved from the first position to the second position.

10. The electronic device of claim 8, further comprising an electronic component housed in the housing, wherein
    the housing comprises a second section in which the electronic component is disposed, and
    the intervening portion comprises a first partition wall configured to separate the first section from the second section.

11. The electronic device of claim 8, wherein the intervening portion comprises a second partition wall configured to partially cover the insertion portion.

12. The electronic device of claim 1, wherein the second hook portions each comprise a claw configured to catch corresponding one of the first hook portions.

13. The electronic device of claim 12, wherein
    the second hook portions each comprise a flexible portion that is elastically deformable and from which the claw protrudes, and
    a protruded length of the claw is configured to be larger than a distance between the corresponding second hook portion and the intervening portion.

14. The electronic device of claim 1, wherein
    the first hook portions each comprise a rib extending along an edge of the opening, and
    each of the second hook portions is configured to catch an end portion of the corresponding rib.

15. The electronic device of claim 1, wherein the first hook portions are harder than the second hook portions.

16. An electronic device comprising:
    a housing comprising a pair of first hook portions extending in one direction and an opening extending in the one direction and being between the pair of first hook portions;
    a member comprising a pair of second hook portions configured to catch the first hook portions and being movable in the opening in the one direction; and
    an intervening portion configured to be between the pair of second hook portions, wherein
    the intervening portion is configured to keep the member in a movable state and come into contact with the second hook portions that elastically approach to each other such that the second hook portions keep catching the first hook portions, and comprises a fixing claw configured to elastically catch the housing.

17. An electronic device comprising:
a housing that comprises a pair of first hook portions extending in one direction and an opening extending in the one direction and being positioned between the pair of first hook portions;
a member that comprises a pair of second hook portions configured to catch the pair of first hook portions and being movable in the opening in the one direction;
an intervening portion attached to the housing, the intervening portion positioned between the pair of second hook portions; and
a moving portion positioned between the second hook portions and configured to move the member in the one direction,
wherein the intervening portion is further configured to cover the moving portion and maintain the member in a movable state, the intervening portion being in contact with the pair of second hook portions that elastically approach to each other to maintain a coupling of the pair of second hook portions to the pair of first hook portions.

18. The electronic device of claim 17, wherein
the member comprises a wall portion from which the second hook portions protrude, and
the moving portion is configured to be surrounded by the second hook portions, the wall portion, and the intervening portion.

19. The electronic device of claim 17, further comprising:
a component configured to be detachably attached to a part subjected to attachment provided to the housing, wherein
the member is movable between a first position and a second position, the component being configured to be fixed to the part subjected to attachment at the first position, the component being configured to be detached from the part subjected to attachment at the second position.

20. The electronic device of claim 17, wherein
the first hook portions each comprise a rib extending along an edge of the opening, and
each of the second hook portions is configured to catch an end portion of the corresponding rib.

* * * * *